(12) United States Patent
Naganuma et al.

(10) Patent No.: US 6,277,718 B1
(45) Date of Patent: *Aug. 21, 2001

(54) SEMICONDUCTOR DEVICE AND METHOD FOR FABRICATING THE SAME

(75) Inventors: Hiroyuki Naganuma; Shinji Sugatani, both of Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/047,522

(22) Filed: Mar. 25, 1998

(30) Foreign Application Priority Data

Sep. 29, 1997 (JP) .................................................. 9-264410

(51) Int. Cl.[7] .................... H01L 21/3205; H01L 21/4763
(52) U.S. Cl. .......................... 438/585; 438/305; 438/910
(58) Field of Search ..................................... 438/585, 910, 438/305

(56) References Cited

U.S. PATENT DOCUMENTS 5,897,346 * 4/1999 Yamaguchi et al. ................. 438/162

FOREIGN PATENT DOCUMENTS

| 02-159069 | 6/1990 | (JP) . |
| 03-163876 | 7/1991 | (JP) . |

OTHER PUBLICATIONS

Wolf, Silicon Processing for the VLSI Era, vol. 2:Process Integration, pp. 273–275, 1991.*

* cited by examiner

*Primary Examiner*—John F. Niebling
*Assistant Examiner*—Alexander G. Ghyka
(74) *Attorney, Agent, or Firm*—Armstrong, Westerman, Hattori, McLeland & Naughton, LLP

(57) ABSTRACT

The method for fabricating a semiconductor device comprises an insulation film forming step of forming an insulation film 12 on a semiconductor substrate 10, a semiconductor layer forming step of forming a semiconductor layer 14 on the insulation film 12, and an impurity implanting step of implanting an impurity containing hydrogen into the semiconductor layer 14, the method being characterized by further comprising a fluorine implanting step of implanting fluorine in at least the insulation film 12. The dangling bonds of the insulation film can be bonded with the fluorine, whereby the fluorine, which has higher bonding energy with respect to silicon of the insulation film than hydrogen, is never dissociated from the silicon of the insulation film in the following heat treatments, BT stress test, etc. Accordingly, an interface state density in the interface between the insulation film and the semiconductor substrate can be depressed low, and a fixed charge in the insulation film can be depressed small. The semiconductor device and the method for fabricating the same can be reliable. The fluorine ion dose is suitably set to thereby prevent the insulation film from thickening. The method for fabricating a semiconductor device having good electric characteristics can be provided.

16 Claims, 6 Drawing Sheets

SEMICONDUCTOR DEVICE AND METHOD FOR FABRICATING THE SAME

BACKGROUND OF THE INVENTION

The present invention relates to a semiconductor device and a method for fabricating the same, more specifically to a MIS (Metal Insulator Semiconductor) semiconductor device and a method for fabricating the same.

Many of the conventional p-MOS (p-channel Metal Oxide Semiconductor) transistors use as the gate electrodes an n-silicon layer, which facilitates their fabrication methods. P-MOS transistors using an n-silicon layer as the gate electrodes are called buried-channel p-MOS transistors because the channels are formed in the semiconductor substrates, spaced from the surfaces of the substrates.

However, it is known that the buried channel MOS transistor is generally more susceptible to the short channel effect in comparison with the surface channel MOS transistor. In applying such buried channel p-MOS transistor to a semiconductor device of high integration, such as an LSI or others, the channel region thereof is so short that even when a length the channel region even a little deviates due to troubles of fabrication precision, threshold voltage characteristics are much changed. Accordingly, for a semiconductor device of high integration, such as an LSI or others, the surface channel p-MOS transistor, whose threshold voltage characteristics little change with respect to a deviation of a length of the channel region, is required.

In the surface channel p-MOS transistor, for the channel to be formed near the surface of the semiconductor substrate it is necessary to use a p-silicon layer as the gate electrode. It is proposed that such p-silicon layer is formed by forming a silicon layer on a gate insulation film and then implanting boron (B) ions in the silicon layer.

However, boron atoms have a small mass, and, in ion implantation, pass through the silicon layer and the gate insulation film below the silicon layer to adversely arrive at the inside of the semiconductor substrate, with a result that a p-impurity is present in the channel region in the semiconductor substrate. Required characteristics cannot be obtained. To prevent the boron from arriving at the inside of the semiconductor substrate, boron must be implanted at low energy, but it is difficult in terms of characteristics of the ion implantation apparatus to control the ion implantation apparatus so as to implant boron ions at low energy.

Then, it is proposed to implant boron in the gate electrode by the use of decaborane ($B_{10}H_{14}$) or boron fluoride ($BF_2$). The method of implanting boron in the gate electrode by the use of boron fluoride is described in, e.g., Japanese Laid-Open Patent application No. 02-159069. In using decaborane or boron fluoride, these molecules have larger masses than boron, and can prevent the boron from arriving at the inside of the semiconductor substrate without much lowering implantation energy.

However it has been found that in the method of implanting decaborane in the gate electrode, hydrogen contained in decaborane bonds with the silicon of the gate insulation film, and the following heat treatment or others dissociates the hydrogen and the silicon to adversely increase dangling bonds. Often the hydrogen is dissociated from the silicon to adversely increase dangling bonds of the silicon in a case that a BT stress (Bias Temperature Stress) test is conducted with a plus or minus voltage applied to the gate and at a high ambient temperature. Increase of the dangling bonds increases an interface state density in the interface between the gate insulation film and the semiconductor substrate and also increases fixed charge in the gate insulation film, whereby device characteristics, such as drain current, threshold voltage, mutual conductance, etc. tend to be deteriorated, and accordingly reliability is lowered. This has been a disadvantage of the method of implanting decaborane.

Generation of dangling bonds by the influence of hydrogen is not limited to the implantation of decaborane into the gate electrode. Hydrogen is generated by film forming by, e.g., plasma CVD (plasma Chemical Vapor Deposition), plasma etching, etc., and the hydrogen has caused the same problem. In sintering for ohmic contact of electrodes, annealing is performed in an atmosphere of hydrogen and oxygen, and the hydrogen used here has caused the same problem.

In the method for implanting boron fluoride in the gate electrode, both fluorine and boron are present in the silicon layer, and the following heat treatment, etc. cause a diffusion speed of the fluorine and that of the boron to mutually influence on each other to cause mutually accelerating diffusion in which their diffusion speeds are increased. The boron passes through the gate insulation film to arrive at the channel region in the semiconductor substrate to cause deviations of a threshold voltage, etc. This has been a problem of the method of implanting boron fluoride. In addition, a large dose of boron fluoride causes the fluorine to adversely thicken the gate insulation film and resultantly to lower a threshold voltage.

SUMMARY OF THE INVENTION

An object of the present invention is to provide a semiconductor device which is highly reliable and has stable electric characteristics, and a method for fabricating the same.

The above-described object is achieved by a method for fabricating a semiconductor device including an insulation film forming step of forming an insulation film on a semiconductor substrate; a semiconductor layer forming step of forming a semiconductor layer on the insulation film; and an impurity implanting step of implanting an impurity containing hydrogen in the semiconductor layer, the method further comprising a fluorine implanting step of implanting fluorine in at least the insulation film. The dangling bonds of the insulation film can be bonded with the fluorine, whereby the fluorine, which has higher bonding energy with respect to silicon of the insulation film than hydrogen, is never dissociated from the silicon of the insulation film in the following heat treatments, BT stress test, etc. Accordingly, an interface state density in the interface between the insulation film and the semiconductor substrate can be depressed low, and a fixed charge in the insulation film can be depressed small. The semiconductor device and the method for fabricating the same can be reliable. The fluorine ion dose is suitably set to thereby prevent the insulation film from thickening. The method for fabricating a semiconductor device having good electric characteristics can be provided.

In the above-described method for fabricating a semiconductor device it is preferable that the impurity contains boron.

The above-described object is achieved by a method for fabricating a semiconductor device including an insulation forming step of forming an insulation film on a semiconductor substrate; a semiconductor layer forming step of forming a semiconductor layer on the insulation film; an impurity implanting step of implanting an impurity in the semiconductor layer; and a step of mixing hydrogen in the insulation film, the method further comprising a fluorine implanting step of implanting fluorine in at least the insulation film. The dangling bonds of the insulation film can be bonded with the fluorine, whereby the fluorine, which has higher bonding energy with respect to silicon of the insulation film than hydrogen, is never dissociated from the silicon of the insulation film in the following heat treatments, BT stress test, etc. Accordingly, an interface state density in the interface between the insulation film and the semiconductor substrate can be depressed low, and a fixed charge in the insulation film can be depressed small. The method for fabricating the same can be reliable. The fluorine ion dose is suitably set to thereby prevent the insulation film from thickening, and the method for fabricating a semiconductor device having good electric characteristics can be provided.

In the above-described method for fabricating a semiconductor device, it is preferable that the fluorine implanting step includes an ion implanting step of implanting ions of the fluorine from above the semiconductor layer; and a heat treatment step of diffusing the fluorine in the insulation film by a heat treatment.

In the above-described method for fabricating a semiconductor device, it is preferable that in the ion implanting step, ions of the fluorine are implanted at energy which does not allow the fluorine to reach the semiconductor substrate.

In the above-described method for fabricating a semiconductor device, it is preferable that the fluorine implanting step includes a fluorine content film forming step of forming a fluorine content film on the semiconductor layer; and a heat treatment step of diffusing the fluorine contained in the fluorine content film in the insulation film by a heat treatment.

In the above-described method for fabricating a semiconductor device, it is preferable that the fluorine content film is an SiOF film.

In the above-described method for fabricating a semiconductor device, it is preferable that in the semiconductor layer forming step, the semiconductor layer containing fluorine is formed; and in the fluorine implanting step, the fluorine contained in the semiconductor layer is diffused into the insulation film by a heat treatment.

In the above-described method for fabricating a semiconductor device, it is preferable that the fluorine content film is a silicon layer containing fluorine.

In the above-described method for fabricating a semiconductor device, it is preferable that further comprises a patterning step of patterning the semiconductor layer in a set configuration to form a gate electrode; and in which in the impurity implanting step, the impurity is implanted in a source/drain region with the gate electrode as a mask.

The above-described object is achieved by a semiconductor device comprising a semiconductor substrate; an insulation film formed on the semiconductor substrate; and a semiconductor layer formed on the insulation film and doped with an impurity containing hydrogen, fluorine being implanted in at least the insulation film. The dangling bonds of the insulation film can be bonded with the fluorine, whereby the fluorine, which has higher bonding energy with respect to silicon of the insulation film than hydrogen, is never dissociated from the silicon of the insulation film in the following heat treatments, BT stress test, etc. Accordingly, an interface state density in the interface between the insulation film and the semiconductor substrate can be depressed low, and a fixed charge in the insulation film can be depressed small. The semiconductor device can be reliable. The fluorine ion dose is suitably set to thereby prevent the insulation film from thickening. The method for fabricating a semiconductor device having good electric characteristics can be provided.

DETAILED DESCRIPTION OF THE INVENTION

[First Embodiment]

Figure 1A:
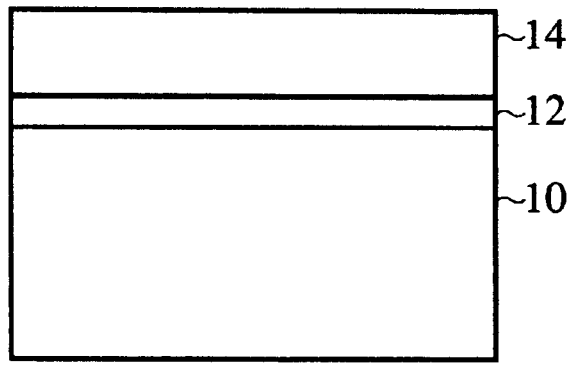
FIGS. 1A–1D is sectional views of the semiconductor device according to the first embodiment of the present invention in the steps of the method for fabricating the same, which explain the method.
Figure 1B:
Figure 1B:
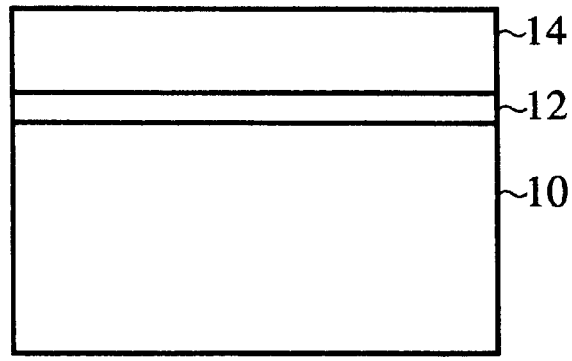
Figure 1C:
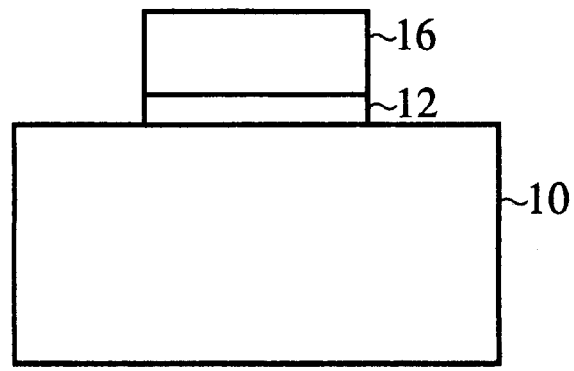
Figure 1D:
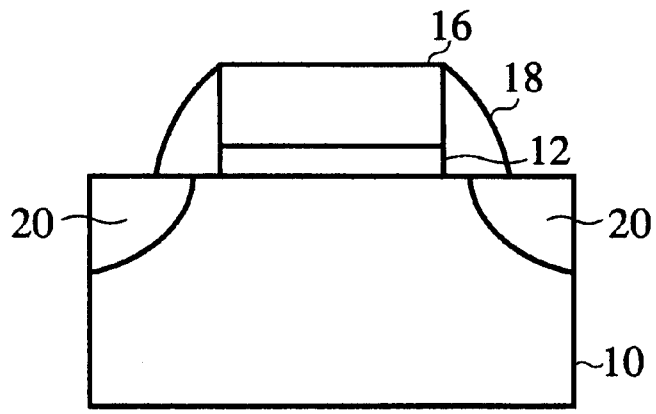
Figure 2:
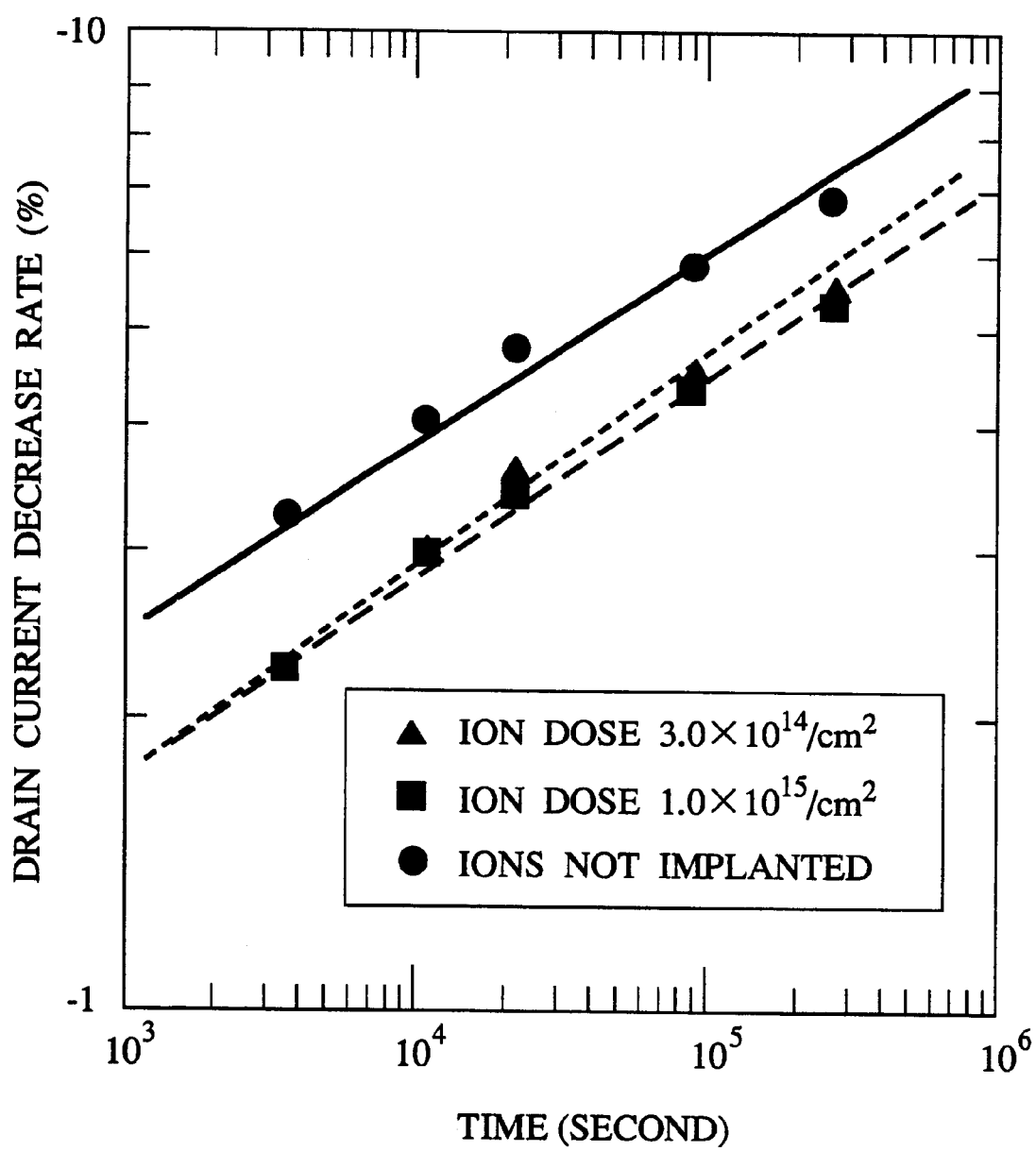
FIG. 2 is a graph of results of BT stress tests.

The semiconductor device according to a first embodiment of the present invention and a method for fabricating the same will be explained with reference to FIGS. 1 to 3. FIG. 1 is sectional views of the semiconductor device according to the present embodiment in the steps of the method for fabricating the same, which explain the method. FIG. 2 is a graph of a result of a BT stress test. FIG. 3 is sectional views of the semiconductor device according to the present embodiment in the steps of another method for fabricating the same, which explain the method.

First, an about 5.5 nm-thickness gate insulation film 12 is formed on a (100) silicon substrate 10 by dry oxidation or wet oxidation. Then, an about 18 nm-thickness polysilicon layer 14 is deposited on the gate insulation film 12 by CVD (Chemical Vapor Deposition) (see FIG. 1A).

Next, fluorine ions are implanted from above the polysilicon layer 14 by an ion implanting apparatus. Energy applied to the ions is about 30 keV, and an ion dose is about $3 \times 10^{14}/cm^2$. Preferably energy applied to the ions is suitably set within a range which does not cause the fluorine ions to arrive at the inside the semiconductor substrate 10. As a condition which prevents the gate insulation film 12 from thickening and decrease an interface state density between the gate insulation film 12 and the semiconductor substrate 10, a dose of fluorine ions is preferably in a range of $1 \times 10^{13}/cm^2$ to $3 \times 10^{15}/cm^2$, but preferably a dose of fluorine ions is suitably set in connection with kinds and doses of ions to be implanted into a gate electrode 16 and a source/drain diffused layer 20 in later steps. When fluorine ions are implanted into the polysilicon layer 14, the fluorine ions are often implanted into an n-MOS (n-channel Metal Oxide Semiconductor) transistor (not shown) formed in a different region without any problem in connection with characteristics (see FIG. 1B).

Then a photoresist (not shown) is applied to the polysilicon layer 14, exposed and developed to be patterned in a configuration of a gate electrode 16. Then, with the photoresist as a mask the polysilicon layer 14 is etched to form the gate electrode 16 and patterns the gate insulation film 12 in the configuration of the gate electrode 16 (FIG. 1C).

Then, an about 100 nm-thickness silicon oxide film (not shown) is formed on the entire surface by CVD. A forming condition is 800° C. At this time heat of 800° C. is applied to the gate electrode 16 and the gate insulation film 12, and fluorine and silicon in the gate electrode 16 and the gate insulation film 12 are activated, and the fluorine combines with dangling bonds of the silicon. Because fluorine has higher bonding energy than hydrogen, bonds of the silicon with the fluorine are never replaced by bonds of the silicon with the hydrogen even by a later heat treatment or others. Thus occurrence of dangling bonds is prevented. Occurrence of dangling bonds in the interface between the gate insulation film 12 and the semiconductor substrate 10 is prevented, and an interface state density in the interface between the gate insulation film 12 and the semiconductor substrate 10 is depressed low.

Then, the silicon oxide film is anisotropially etched to form a sidewall 18 of the silicon oxide film. Then, with the gate electrode 16 and the sidewall 18 as a mask decaborane is implanted in a source/drain diffused layer 20. The decaborane is implanted not only in the source/drain diffused layer 20 but also in the gate electrode 16. Then, lamp annealing is performed for 10 seconds at 1000° C. to activate boron of the source/drain diffused layer 20 and the gate electrode 16. Thus, the surface channel-type semiconductor device according to the present embodiment including the source/drain diffused layer 20 and the gate electrode 16 of p-conduction type is fabricated (FIG. 1D).

(Characteristics Evaluation Result)

Then, the result of characteristic evaluation of the thus-fabricated semiconductor device according to the present embodiment will be explained.

This evaluation result is of a case that, for convenience, boron in place of decaborane was implanted in the gate electrode 16. It was confirmed by other experiments or others that substantially the same data was obtained by the implantation of decaborane as by the implantation of boron. Accordingly it was safe to consider that in the method for fabricating the semiconductor device according to the present embodiment, substantially the same evaluation result would be obtained by the implantation of decaborane as by the implantation of boron. Energy applied to fluorine ions was uniformly 30 keV when fluorine ions were implanted into the gate electrode 16.

First, the measurement result of interface state densities in the interface between the gate insulation film 12 and the semiconductor substrate 10 will be explained. The interface state densities were measured by charge pumping method.

An interface state density was $5.76 \times 10^{10}/cm^2$ when no fluorine ion was implanted in the gate electrode 16; an interface state density was $4.43 \times 10^{10}/cm^2$ when a fluorine dose was $3.0 \times 10^{14}/cm^2$; and an interface state density was $4.82 \times 10^{10}/cm^2$ when a fluorine dose was $1.0 \times 10^{15}/cm^2$. That is, it is found that the implantation of fluorine ions in the gate electrode 16 can depress low an interface state density in the interface between the gate insulation film 12 and the semiconductor substrate 10.

Next, the result of measurement of film thicknesses of the gate insulation film 12 will be explained.

A film thickness of the gate insulation film 12 was 6.17 nm when no fluorine ion was implanted in the gate electrode 16. When fluorine ions were implanted in a $3.0 \times 10^{14}/cm^2$ dose, a film thickness of the gate insulation film 12 was 6.14 nm. When fluorine ions were implanted in a $1.0 \times 10^{15}/cm^2$ dose, a film thickness of the gate insulation film 12 was 6.17 nm. That is, it is found that even when fluorine ions are implanted in the gate electrode 16, the gate insulation film 12 never thickens.

Next, the result of BT stress tests will be explained with reference to FIG. 2. A BT stress test is a test in which with a plus or minus voltage applied to the gate a stress test is performed at a high ambient temperature. In a p-MOS transistor, characteristic deterioration is more rapid when a minus voltage is applied, and in the present embodiment, with a −3.3 V gate voltage applied and at a 200° C. ambient temperature, deterioration of the semiconductor device, specifically a decrease rate of drain current IDs (Saturated Drain Current) was measured. In FIG. 2 time in which a stress was applied to the semiconductor device was taken on the horizontal axis, and decrease rates of the drain current IDs (dIDs/IDs (%)) in a saturated region was taken on the vertical axis. Changes of the drain current IDs in the saturated region were based on a value of the drain current IDs before a stress was applied. As shown in FIG. 2, when fluorine ions were not implanted, a time until the drain current IDs decreases to a certain ratio is short, i.e., the characteristic is deteriorated in a short time. In contrast to this, when fluorine ions were implanted in the gate electrode 16, a time until the drain current IDs decreases to a certain ratio is long, i.e., deterioration of the characteristics is mitigated.

As described above, according to the present embodiment, fluorine ions are implanted from above the gate electrode, and then a heat treatment is performed to combine dangling bonds of the silicon of the gate insulation film with the fluorine, whereby the fluorine, which has higher bonding energy with respect to silicon than hydrogen, is never dissociated from the silicon in the following heat treatments, BT stress test, etc. Accordingly, an interface state density in the interface between the gate insulation film and the semiconductor substrate can be depressed low, and a fixed charge in the gate insulation film can be depressed small. The semiconductor device and the method for fabricating the same can be reliable.

According to the present embodiment, the fluorine ion dose is suitably set to thereby prevent the gate insulation film from thickening. The semiconductor device and the method for fabricating the same can have good electric characteristics.

[Another Method for Fabricating the Semiconductor Device According to the First Embodiment]

Figure 3A:
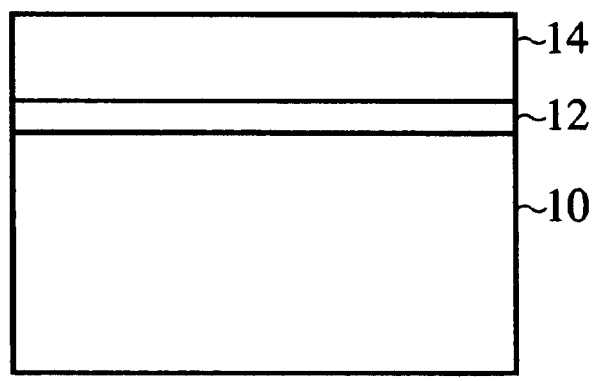
FIGS. 3A–3C is sectional views of the semiconductor device according to the first embodiment in the steps of another method for fabricating the same, which explain the method.
Figure 3B:
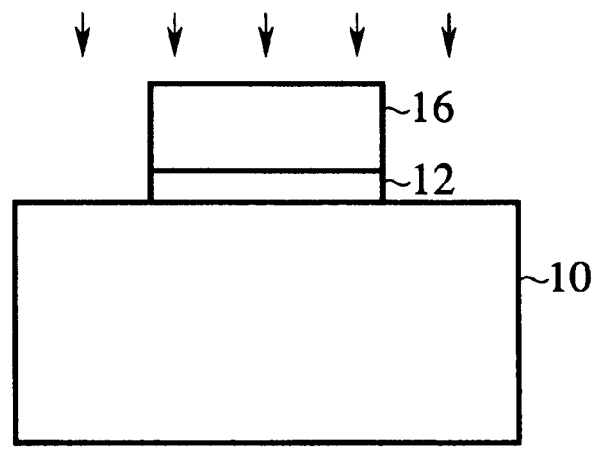
Figure 3C:
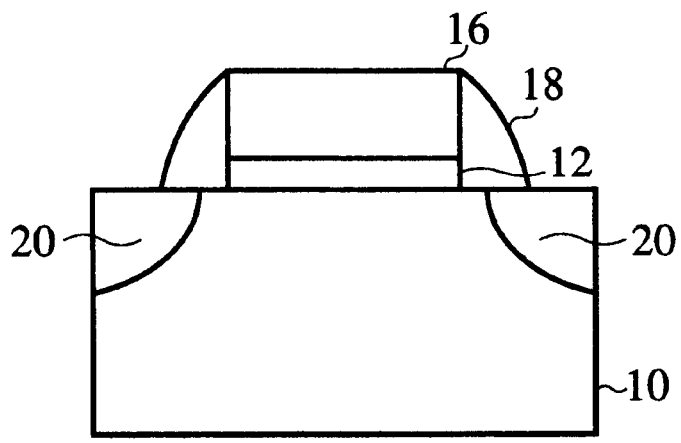

As shown in FIG. 3, it is possible that the gate insulation film 12 and the polysilicon film 14 are formed on the semiconductor substrate 10 in the same way as described above (see FIG. 3A); the polysilicon layer 14 and the gate insulation film 12 are patterned in a configuration of the gate electrode 16 by photoetching as described above, and then fluorine ions are implanted (see FIG. 3B); and then the sidewall 18 is formed, and next the source/drain diffused layer 20 is formed (see FIG. 3C).

[A Second Embodiment]

The semiconductor device according to a second embodiment of the present invention and a method for fabricating the same will be explained with reference to FIGS. 4 and 5. FIG. 4 is sectional views of the semiconductor device according to the present embodiment in the steps of the method for fabricating the same, which explain the method. FIG. 5 is sectional views of the semiconductor device according to the present embodiment in the steps of another method for fabricating the same, which explain the method. The same reference numbers of the present embodiment as those of the semiconductor device according to the first embodiment and the method for fabricating the semiconductor device are represented by the same reference numbers not to repeat or to simplify their explanation.

The semiconductor device according to the present embodiment and the method for fabricating the same are characterized mainly in that after an SiOF film 22 containing fluorine is formed on a polysilicon layer 14, and then the fluorine contained in the SiOF film 22 is diffused in solid state by a heat treatment to combine dangling bonds in a gate insulation film 12 with the fluorine.

Figure 4A:
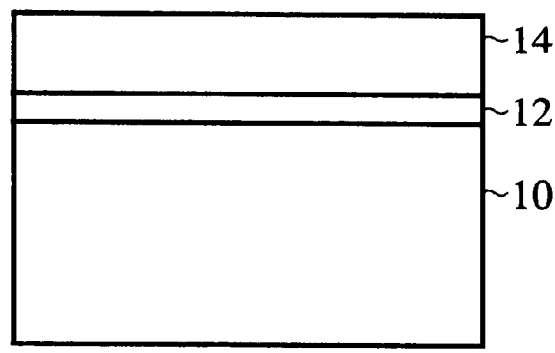
FIGS. 4A–4D is sectional views of the semiconductor device according to a second embodiment in the steps of the method for fabricating the same, which explain the method.
Figure 4B:
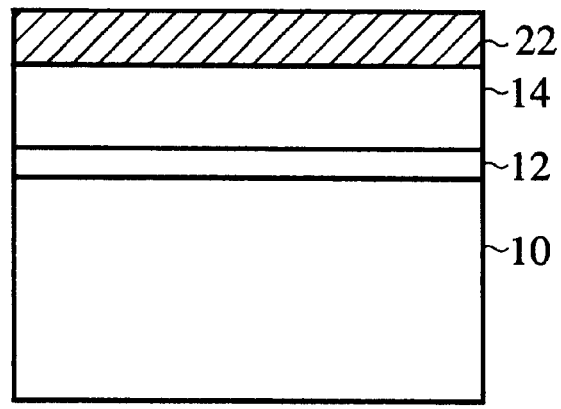
Figure 4C:
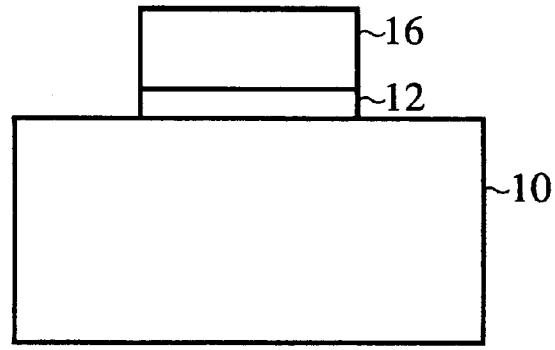

First, in the same way as in the first embodiment, the gate insulation film 12 and the polysilicon layer 14 are formed on the semiconductor substrate 10 (see FIG. 4A).

Next, the SiOF film 22 of an about 50 nm thickness is formed by CVD using $SiF_4$, monosilane ($SiH_4$) and oxygen as a raw material gas. A forming condition is 600 to 620° C. Then an about 700° C. heat treatment is performed to diffuse in solid state the fluorine from the SiOF film 22, and the fluorine combines with dangling bonds in the gate insulation film 12 (see FIG. 4B).

Then, the SiOF film 22 is removed by the use of a hydrogen fluoride etchant. The SiOF film 22 may be removed by dry etching. Then, in the same way as in the first embodiment, the polysilicon layer 14 is patterned in a configuration of the gate electrode 16 by photoetching to form the gate electrode 16, and the gate insulation film 12 is patterned in the configuration of the gate electrode 16 (see FIG. 4C).

Figure 4D:
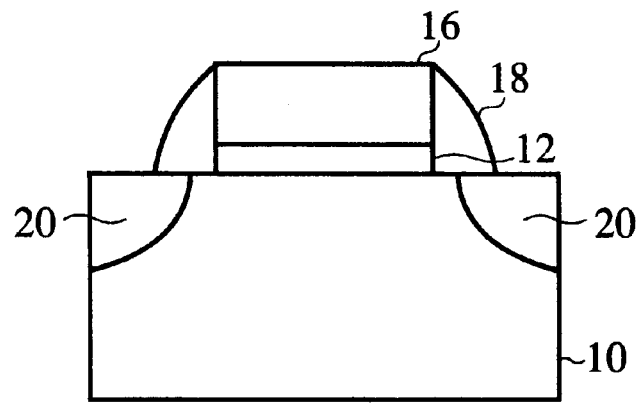

Next, in the same way as in the first embodiment, a sidewall 18 and a source/drain diffused layer 20 are formed, and the semiconductor device according to the present embodiment is fabricated (see FIG. 4D).

As described above, according to the present embodiment, the SiOF film is formed on the polysilicon layer by CVD, and then a heat treatment is performed to combine fluorine with dangling bonds in the gate insulation film, whereby without the use of an ion implantation apparatus, the semiconductor device and the method for fabricating the same can be highly reliable and have good electric characteristics. Because no ion implantation apparatus is required, it is not necessary to mount the semiconductor substrate in the ion implantation apparatus, which makes it possible to fabricate the semiconductor device in an uninterrupted process.

[Another Method for Fabricating the Semiconductor Device According to the Second Embodiment]

Figure 5A:
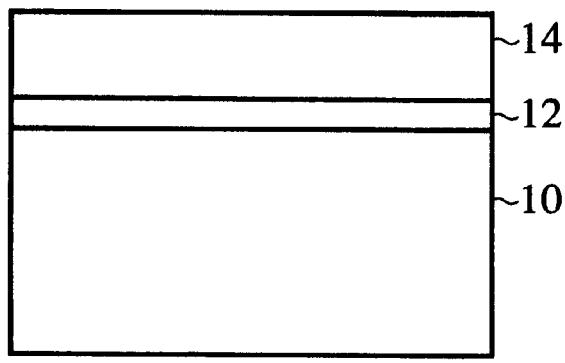
FIGS. 5A–5D is sectional views of the semiconductor device according to the second embodiment in the steps of another method for fabricating the same, which explain the method.
Figure 5B:
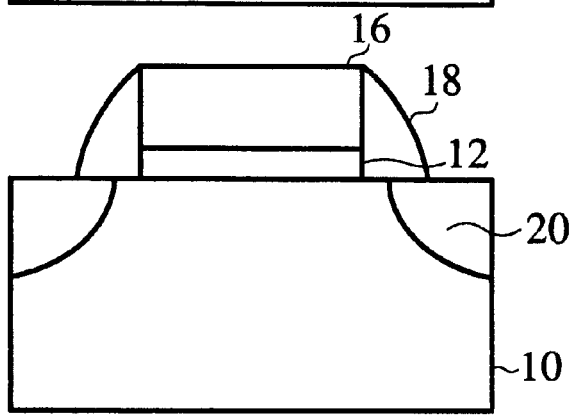
Figure 5C:
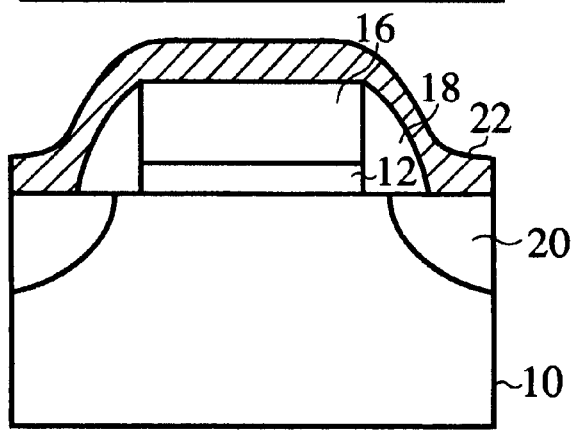
Figure 5D:
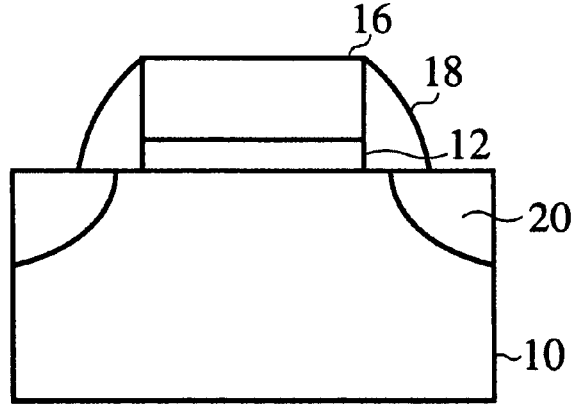

As shown in FIG. 5, it is possible that the gate insulation film 12 and the polysilicon layer 14 are formed on the semiconductor substrate 10 as described above (see FIG. 5A); the polysilicon layer 14 and the gate insulation film 12 are patterned in the configuration of the gate electrode 16 by photoetching as described above, and then the sidewall 18 and the source/drain diffused layer 20 are formed (see FIG. 5B); and then the SiOF film 22 is formed, and the fluorine is diffused in solid state by a heat treatment (FIG. 5C); and then the SiOF film 22 is removed (see FIG. 5D).

[A Third Embodiment]

Figure 6A:
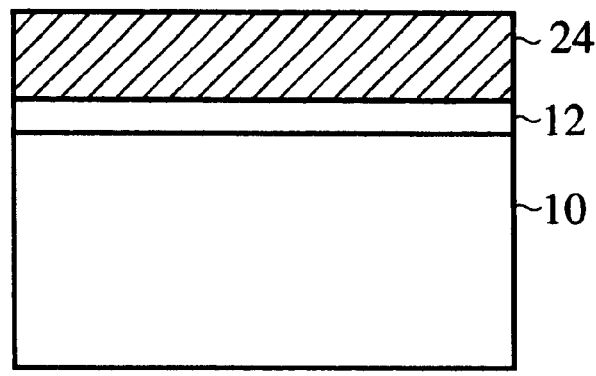
FIGS. 6A–6C is sectional views of the semiconductor device according to a third embodiment of the present invention in the steps of the method for fabricating the same, which explain the method.

The semiconductor device according to a third embodiment of the present invention and the method for fabricating the same will be explained with reference to FIG. 6. FIG. 6 is sectional views of the semiconductor device in the steps of the method for fabricating the same, which explain the method. The same members of the first or the second embodiment as those of the semiconductor device and the method for fabricating the same are represented by the same reference numbers not to repeat or to simplify their explanation.

The semiconductor device according to the present embodiment and the method for fabricating the same are characterized mainly in that a gate electrode is formed of a polysilicon layer containing fluorine, and the fluorine contained in the polysilicon layer is diffused in solid state by a heat treatment to combine the fluorine with dangling bonds in the gate insulation film.

First, in the same way as in the second embodiment, a gate insulation film 12 is formed on a semiconductor substrate 10, and then an about 180 nm-thickness polysilicon layer 24 containing fluorine is formed on the gate insulation film 12 by CVD using $SiF_4$ and monosilane ($SiH_4$) as a raw material gas. A film forming condition is 600 to 620° C. Then, an about 700° C. heat treatment is performed to diffuse the fluorine in solid state from the polysilicon layer 24 to combine the fluorine with dangling bonds in the gate insulation film 12 (see FIG. 6A).

Figure 6B:
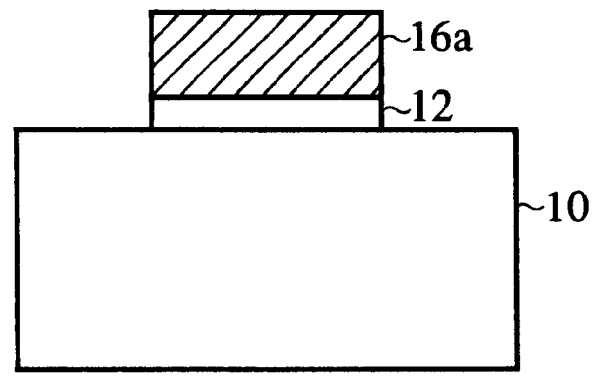

Then, in the same way as in the second embodiment, the polysilicon layer 24 is patterned to form a gate electrode 16a, and the gate insulation film 12 is patterned in a configuration of the gate electrode 16a (see FIG. 6B).

Figure 6C:
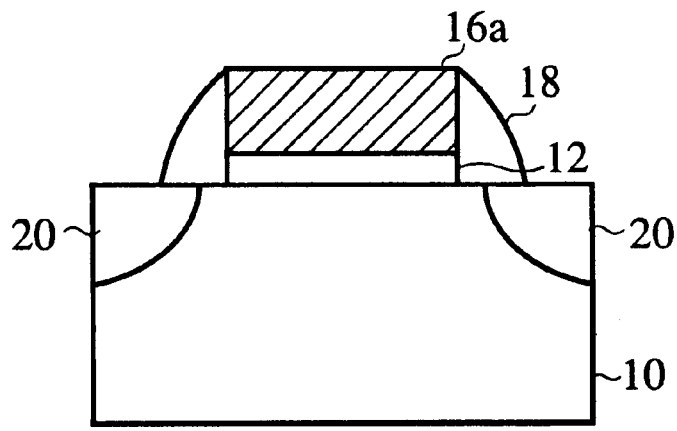

Then, in the same was as in the second embodiment, a sidewall 18 and a source/drain diffused layer 20 are formed, and the semiconductor device according to the present embodiment is fabricated (see FIG. 6C).

As described above, according to the present embodiment, the gate electrode is formed of the polysilicon layer containing fluorine, which makes it unnecessary to form an SiOF film in addition to the polysilicon layer, and accordingly the fabricating method can have a smaller number of fabrication steps.

[Modifications]

The present invention is not limited to the above-described embodiments and can cover other various modifications.

For example, in the first to the third embodiments decaborane is implanted in the gate electrode after fluorine is combined with the dangling bonds in the insulation film, but the fluorine may be combined with the dangling bonds at any time and, for example, after decaborane is implanted in the gate electrode.

In the first to the third embodiments decaborane is implanted in the gate electrode and the source/drain diffused layer. Decaborane is not essential, and other compounds, such as boron fluoride or others, may be used. The present invention is a technique for fabricating a semiconductor device free from influence of hydrogen and can find various applications as long as the applications are semiconductor devices and methods for fabricating the same having steps, as of forming film by plasma CVD, plasma etching or others, in which hydrogen is generated.

In the second embodiment SiOF film, which is an insulation film, was used, but an insulation film is not essential as long as the film contains fluorine. For example, when a conducting film containing fluorine is used, the conducting film can be used as the gate electrode, which makes it possible to omit the step of removing the conducting film.

In the third embodiment a heat treatment is performed before patterning the gate electrode 16a. The heat treatment is not essentially before patterning the gate electrode 16a and may be after patterning the gate electrode 16a.

In the first to the third embodiments polysilicon layer is used, but polysilicon layer is not essential. In place of polysilicon layer, non-crystalline silicon or others, for example, may be used.

What is claimed is:

1. A method for fabricating a semiconductor device including an insulation film forming step of forming an insulation film on a semiconductor substrate; a semiconductor layer forming step of forming a semiconductor layer on the insulation film; and an impurity implanting step of implanting decaborane in the semiconductor layer, the method further comprising a fluorine implanting step of implanting fluorine in at least the insulation film.

2. A method for fabricating a semiconductor device according to claim 1, wherein the fluorine implanting step includes an ion implanting step of implanting ions of the fluorine from above the semiconductor layer; and a heat treatment step of diffusing the fluorine in the insulation film by a heat treatment.

3. A method for fabricating a semiconductor device according to claim 2, wherein in the ion implanting step, ions of the fluorine are implanted at energy which does not allow the fluorine to reach the semiconductor substrate.

4. A method for fabricating a semiconductor device including an insulation film forming step of forming an insulation film on a semiconductor substrate; a semiconductor layer forming step of forming a semiconductor layer on the insulation film; an impurity implanting step of implanting molecular ion containing hydrogen and boron in the semiconductor layer so as to dope boron as an impurity, and a fluorine implanting step of implanting fluorine in at least the insulation film, wherein fluorine implanting step includes a fluorine content film forming step of forming a fluorine content film on the semiconductor layer; and a heat treatment step of diffusing the fluorine contained in the fluorine content film in the insulation film by a heat treatment.

5. A method for fabricating a semiconductor device including an insulation film forming step of forming an insulation film on a semiconductor substrate; a semiconductor layer forming step of forming a semiconductor layer on the insulation film; an impurity implanting step of implanting an impurity in the semiconductor layer; a step of mixing hydrogen in the insulation film, and a fluorine implanting step of implanting fluorine in at least the insulation film, wherein the fluorine implanting step includes a fluorine content film forming step of forming a fluorine content film on the semiconductor layer; and a heat treatment step of diffusing the fluorine contained in the fluorine content film in the insulation film by a heat treatment.

6. A method for fabricating a semiconductor device according to claim 4, wherein the fluorine content film is an SiOF film.

7. A method for fabricating a semiconductor device according to claim 5, wherein the fluorine content film is an SiOF film.

8. A method for fabricating a semiconductor device including an insulation film forming step of forming an insulation film on a semiconductor substrate; a semiconductor layer forming step of forming a semiconductor layer on the insulation film; an impurity implanting step of implanting molecular ion containing hydrogen and boron in the semiconductor layer so as to dope boron as an impurity, and a fluorine implanting step of implanting fluorine in at least the insulation film, wherein in the semiconductor layer forming step, the semiconductor layer containing fluorine is formed; and in the fluorine implanting step, the fluorine contained in the semiconductor layer is diffused into the insulation film by a heat treatment.

9. A method for fabricating a semiconductor device including an insulation film forming step of forming an insulation film on a semiconductor substrate; a semiconductor layer forming step of forming a semiconductor layer on the insulation film; an impurity implanting step of implanting an impurity in the semiconductor layer; a step of mixing hydrogen in the insulation film, and a fluorine implanting step of implanting fluorine in at least the insulation film, wherein in the semiconductor layer forming step, the semiconductor layer containing fluorine is formed; and in the fluorine implanting step, the fluorine contained in the semiconductor layer is diffused into the insulation film by a heat treatment.

10. A method for fabricating a semiconductor device according to claim 8, wherein the fluorine content film is a silicon layer containing fluorine.

11. A method for fabricating a semiconductor device according to claim 9, wherein the fluorine content film is a silicon layer containing fluorine.

12. A method for fabricating a semiconductor device according to claim 1, which further comprises a patterning step of patterning the semiconductor layer in a set configuration to form a gate electrode; and in which in the impurity implanting step, the decaborane is implanted in a source/drain region with the gate electrode as a mask.

13. A method for fabricating a semiconductor device according to claim 5, which further comprises a patterning step of patterning the semiconductor layer in a set configuration to form a gate electrode; and in which in the impurity implanting step, the impurity is implanted in a source/drain region with the gate electrode as a mask.

14. A method for fabricating a semiconductor device according to claim 4, which further comprises a patterning step of patterning the semiconductor layer in a set configuration to form a gate electrode; and in which in the impurity implanting step, the molecular ion is implanted in a source/drain region with the gate electrode as a mask.

15. A method for fabricating a semiconductor device according to claim 8, which further comprises a patterning step of patterning the semiconductor layer in a set configuration to form a gate electrode; and in which in the impurity implanting step, the molecular ion is implanted in a source/drain region with the gate electrode as a mask.

16. A method for fabricating a semiconductor device according to claim 9, which further comprises a patterning step of patterning the semiconductor layer in a set configuration to form a gate electrode; and in which in the impurity implanting step, the impurity is implanted in a source/drain region with the gate electrode as a mask.

* * * * *